United States Patent
Abys et al.

[11] Patent Number: 5,916,696
[45] Date of Patent: Jun. 29, 1999

[54] CONFORMABLE NICKEL COATING AND PROCESS FOR COATING AN ARTICLE WITH A CONFORMABLE NICKEL COATING

[75] Inventors: Joseph Anthony Abys, Warren; Chonglun Fan, Basking Ridge; Igor Veljko Kadija, Ridgewood, all of N.J.

[73] Assignee: Lucent Technologies Inc., Murray Hill, N.J.

[21] Appl. No.: 08/660,628

[22] Filed: Jun. 6, 1996

[51] Int. Cl.$^6$ ............................................. B32B 15/01
[52] U.S. Cl. ..................... 428/670; 428/544; 428/600; 428/672; 428/673
[58] Field of Search ................... 428/544, 600, 428/670, 672, 673

[56] References Cited

U.S. PATENT DOCUMENTS

| | | | |
|---|---|---|---|
| 4,122,215 | 10/1978 | Vratny | 427/92 |
| 4,125,648 | 11/1978 | Vratny | 427/305 |
| 4,154,877 | 5/1979 | Vratny | 427/328 |
| 4,178,475 | 12/1979 | Taylor et al. | 179/2 EC |
| 4,767,508 | 8/1988 | Arakida et al. | 204/44.5 |
| 4,911,798 | 3/1990 | Abys et al. | 204/44 |
| 4,911,799 | 3/1990 | Abys et al. | 204/44.6 |
| 5,139,886 | 8/1992 | Truong et al. | 428/577 |
| 5,360,991 | 11/1994 | Abys, et al. | 257/666 |
| 5,436,082 | 7/1995 | Mathew | 428/670 |
| 5,510,197 | 4/1996 | Takahashi et al. | 428/670 |
| 5,693,427 | 12/1997 | Moysan, III et al. | 428/627 |
| 5,716,721 | 2/1998 | Moysan, III et al. | 428/627 |

OTHER PUBLICATIONS

"Nickel Plated Lead Frame —Has Same Thickness of Nickel on Both Surfaces", Database WPI, Section CH, Week 8908, Derwent Publications Ltd., London, GB; Class L03, AN 89–058878, XP002040194, & JP 01 –012 563 A (Sumitomo Metal Mining Co), Abstract (Jan. 17, 1989).

"Plating a Metal With Nickel—Using Bath Containing Carbon Fluoride and/or a Fluorine Cpd. Surfactant, and Controlling Bath Surface Tension to Ensure Good Strength Plating", Database WPI, Section Ch, Week 8011, Derwent Publications, Ltd., London, GB; Class M11, AN 80–19194C, XP002040195 & JP 55 014 869 A (Tokuyama Soda KK), Abstract (Feb. 1, 1980).

"Electroless Plated Ductile Nickel", Kaoru, A. et al Japan Engineering Development Co., Ltd., vol. 23, No. 10, pp. 601–608 (1972).

"Comparision of Some Mechanical and Corrosion Properties of Electroless and Electroplated Nickel–Phosphorus Alloys," Plating and Surface Finishing, Weil et al., pp. 62–66, Feb. 1989.

Electroless Plating: Fundamentals and Applications, pp. 111–121, Mallory et al. Dec. 1990.

"Solderability Tests for Component Leads, Terminations, Lugs, Terminals and Wires", *Joint Industry Standard.*, Apr. 1992.

Crane et al., "Lead Frame Materials", *Electronic Materials Handbook*, vol. 1, pp. 483–492, 1989.

*Primary Examiner*—Nam Nguyen
*Assistant Examiner*—Steven H. Versteeg
*Attorney, Agent, or Firm*—Richard J. Botos

[57] ABSTRACT

The present invention is directed to a lead frame in which the metal lead frame substrate is copper, copper alloy, or nickel alloy. The lead frame substrate is coated with a conformable nickel coating that is crack-resistant when the lead frame is bent to an angle of at least 82 degrees with a bend radius of about 150 $\mu$m to about 300 $\mu$m. Bending the lead frame in this manner causes surface deformations in the lead frame substrate. Cracks do not appear through the thickness of the conformable nickel coating of the present invention when the depth of the deformations that result from this bending do not exceed about 5 $\mu$m.

14 Claims, 8 Drawing Sheets

CONFORMABLE NICKEL COATING AND PROCESS FOR COATING AN ARTICLE WITH A CONFORMABLE NICKEL COATING

BACKGROUND OF THE INVENTION

1. Technical Field

The present invention is directed to a nickel coating that is resistant to cracking and a process for forming such a nickel coating onto an article.

2. Art Background

Devices such as integrated circuits are mechanically and electrically connected to larger assemblies via lead frames. The integrated circuit or other device is mechanically mounted on the lead frame, and the device is then electrically connected to the leads on the lead frame. The lead frame is then electrically and mechanically connected to a larger assembly. After the device is mounted on the lead frame, it is packaged for protection. The packaging process includes wirebonding, trim-and-forming, thermal aging and encapsulation steps. These steps subject the metal lead frame to mechanical stress and strain. For example, when the leads of the lead frame are formed according to the JEDEC standard, the forming angle is 82–90 degrees and the forming radius is about 10 mils (≈250 μm).

Lead frames have been formed from a variety of materials. Lead frame materials are selected for their mechanical strength, conductivity, machinability, formability, corrosion resistance, solderability and thermal expansion. Although gold, platinum, and palladium have the desired characteristics, the cost of these materials makes use of these materials prohibitive for most applications. Copper and copper alloys also have many advantageous properties that make it suited for this application. A number of different copper alloys are used including alloy 151 (99.9 wt. % copper/0.1 wt. % zirconium); alloy 194 (97.5 wt. % copper/2.35 wt. % iron/0.03 wt. % phosphorous/0.12 wt. % zinc); and alloy 7025 (96.2 wt. % copper/3.0 wt. % nickel/0.65 wt. % silicon/0.15 wt. % magnesium). However, the corrosion of the copper in air and the difficulty of forming good soldered connections to copper create the need to use coated copper lead frames. The coating on the lead frame provides corrosion protection and provides a good solderable surface. An iron-nickel alloy, alloy 42, also has properties that make it useful as a lead frame. However, the corrosion of this metal in air also precludes the use of uncoated alloy 42 as a lead frame material.

Typically, the copper and iron containing materials are coated with nickel to prevent the oxidation of the underlying copper or iron. However, nickel also oxidizes in air, and such oxides are undesirable. A thin layer of a metal that does not oxidize is plated over the nickel to prevent these oxides from forming. Examples of these materials, typically referred to as "noble" metals include silver, palladium, and gold. These thin coatings range in thickness from about 0.075 μm to about 1.5 μm.

Nickel coatings applied using conventional electrodeposition techniques have a tendency to crack when the lead frame is subjected to the stresses and strains associated with the trim-and-form steps of device packaging that are discussed above. When the nickel layer cracks, the layer of noble metal thereon also cracks. When these metal coatings crack, the underlying copper or iron alloy oxidizes, corrodes, and migrates to the surface, in the presence of humidity. These surface deposits have an adverse effect on the packaged device. Consequently, a nickel coating for a lead frame that does not crack when the lead frame is subjected to stresses and strains associated with the packaging of electronic devices is required.

SUMMARY OF THE INVENTION

Figure 1:
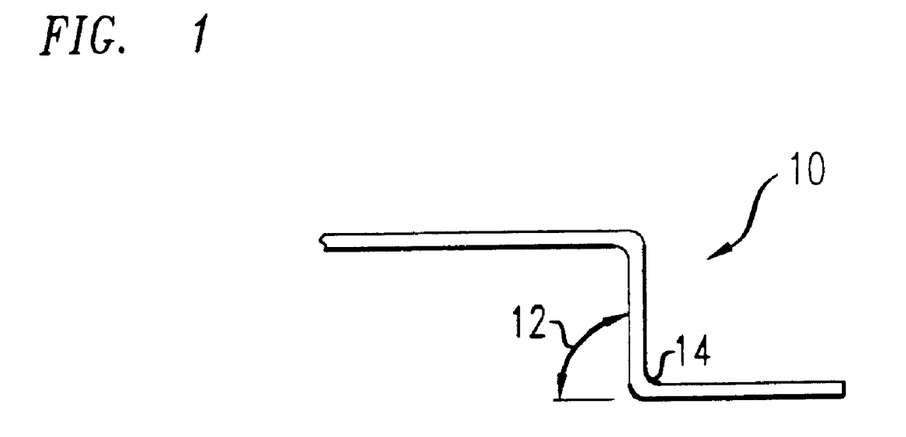
FIG. 1 is a side view of a leads frame after the lead have been formed according to the JEDEC standard.

The present invention is directed to a conformable nickel coating that does not crack when a lead frame on which the conformable nickel coating is applied is formed according to the JEDEC standard, i.e. the forming angle of the leads is at least about 82 degrees with the lead frame with a forming radius of about 10 mils (which is about 250 μm). The forming angle 12 of the lead frame 10 and the forming radius 14 of the lead frame 10 are illustrated in FIG. 1. After forming, the lead frame is coupled to a device, packaged and placed into a larger assembly. The present invention is also directed to a process for forming a conformable nickel layer onto the surface of a metal substrate. Examples of metal substrates include copper substrates, copper alloy substrates, and iron alloy substrates.

In the context of the present invention, a conformable nickel layer is a layer of nickel that conforms to the surface of the metal on which the nickel is plated in such a way as to resist cracking even when the coated lead frame is formed according to the standard described above wherein the forming radius is about 150 μm to about 300 μm. Forming a lead frame according to the above standard introduces deformations in the lead frame substrate. These deformations are in the form of surface undulations that have a depth of 0.1 μm or more. Examples of substrate that are susceptible to these surface deformations include alloy 151 substrates, alloy 194 substrates, alloy 7025 substrates, and alloy 42 substrates. The thicker the substrate, the more susceptible it is to cracking during forming. The conformable nickel coating of the present invention does not crack when the surface deformations that result from lead frame formation have a depth of less than 5 μm. The thickness of the conformable nickel coating of the present invention is at least about 0.5 μm. It is advantageous if the conformable nickel coating of the present invention has a thickness of at least about 2 μm.

The conformable nickel coating of the present invention has an elongation of at least about 25 percent (measured using ASTM Standard B489-85) when a substrate with the conformable nickel coating is formed according to the JEDEC standard. This is a substantial improvement over the elongation of prior art nickel coatings. Elongation (sometimes referred to as ductility) is a measure of the degree to which a coating deforms. The greater the elongation or ductility of the coating, the higher its resistance to cracking when the coated substrate is deformed.

In one embodiment of the present invention, a nickel layer that conforms to the substrate in the desired manner is obtained by plating the lead frame in a plating bath that contains about 75 g/l to about 130 g/l of: nickel as a nickel complex such as $Ni(NH_2SO_3)_2$ and about 3 to about 5 g/l of a nickel salt such as $NiCl_2 \cdot 6H_2O$. It is advantageous if the plating bath contains about 30 g/l to about 45 g/l of a buffer such as $H_3BO_3$ and about 5 ml/l to about 20 ml/l of a perfluorinated quaternary amine wetting agent (based on an aqueous solution containing about 10 ppm of the perfluorinated quaternary amine) such as perfluoro dodecyl trimethyl ammonium fluoride. The composition of the bath is controlled so that the pH of the bath is maintained in the range of about 2 to about 2.5.

It is advantageous if the metal impurities in the bath are about 30 ppm or less. Metal impurities are any metals other than the nickel. In one embodiment of the present invention, the nickel is plated onto the metal lead frame substrate using a plating current density of about 5 Amps/dm$^2$ to about 50 Amps/dm$^2$ at a bath temperature of about 50° C. to about 65° C. It is advantageous if the bath is agitated at a speed of about 25 cm/sec to about 60 cm/sec during plating.

After the conformable nickel coating is formed on the lead frame substrate, a layer of a metal that does not oxidize in air is coated over the nickel to provide a solderable surface, because the nickel will oxidize in air and the oxidized nickel does not permit a good, solderable connection to be formed. Examples of such materials include gold, silver, palladium, and palladium alloys. These layers typically have a thickness of about 0.075 $\mu$m to about 1.5 $\mu$m and are formed on the nickel substrates according to processes well known to those skilled in the art. One exemplary method for forming a palladium layer onto a substrate is described in U.S. Pat. No. 4,911,799 to Abys et al, which is hereby incorporated by reference.

BRIEF DESCRIPTION OF THE DRAWINGS

FIGS. 2A and 2B are in plan view and FIG. 2C is in side view.

FIG. 4A is a side view and FIG. 4B is a top view.

DETAILED DESCRIPTION

The present invention is directed to a conformable nickel coating for lead frame substrates. The lead frame substrates are typically materials such as copper and its alloys (e.g. alloys 151, 194, and 7025 described above) and iron/nickel alloys such as alloy 42. Deformations with a depth of at least 0.1 $\mu$m develop in the surface of these substrates when formed according to the JEDEC standard. The nickel coating has a thickness of at least about 0.5 $\mu$m. It is advantageous if the thickness is at least about 2 $\mu$m. The conformable nickel coating does not crack through its thickness when the lead frame substrate is formed according to standard techniques such as the JEDEC standard, which requires that the lead frame substrate be bent at least 82 degrees with a forming radius of at least about 250 $\mu$m when the deformations in the surface of the substrate that are due to forming have a depth of less than 5 $\mu$m. According to this standard, the substrate has a thickness of at least about 100 $\mu$m.

Figure 2A:
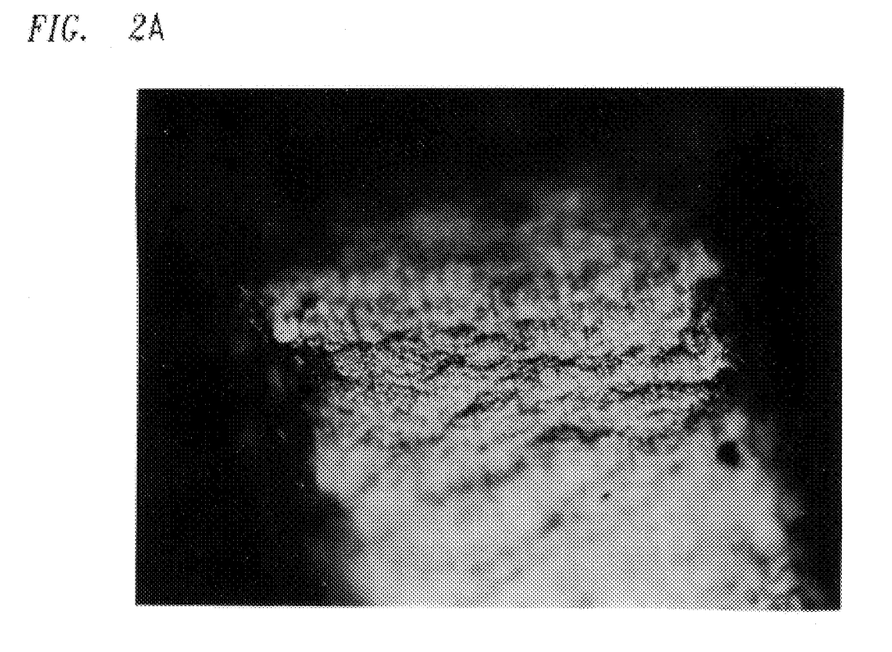
FIGS. 2A–2C are photographs taken at 200×, 400×, and 1000× of an alloy 194 lead frame that was formed to an angle of 90 degrees with a curvature radius of about 250 $\mu$m.
Figure 2B:
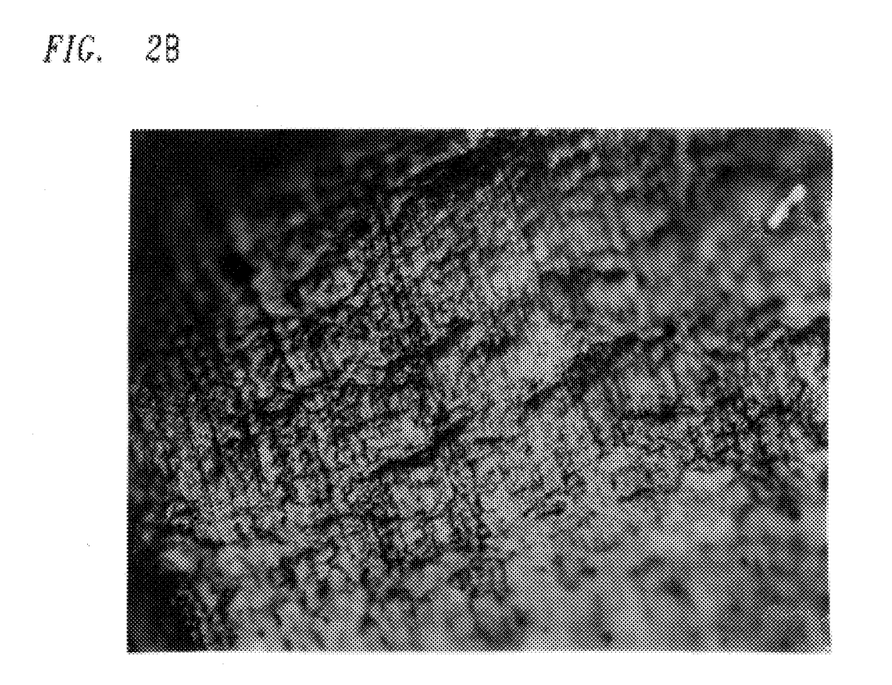
Figure 2C:
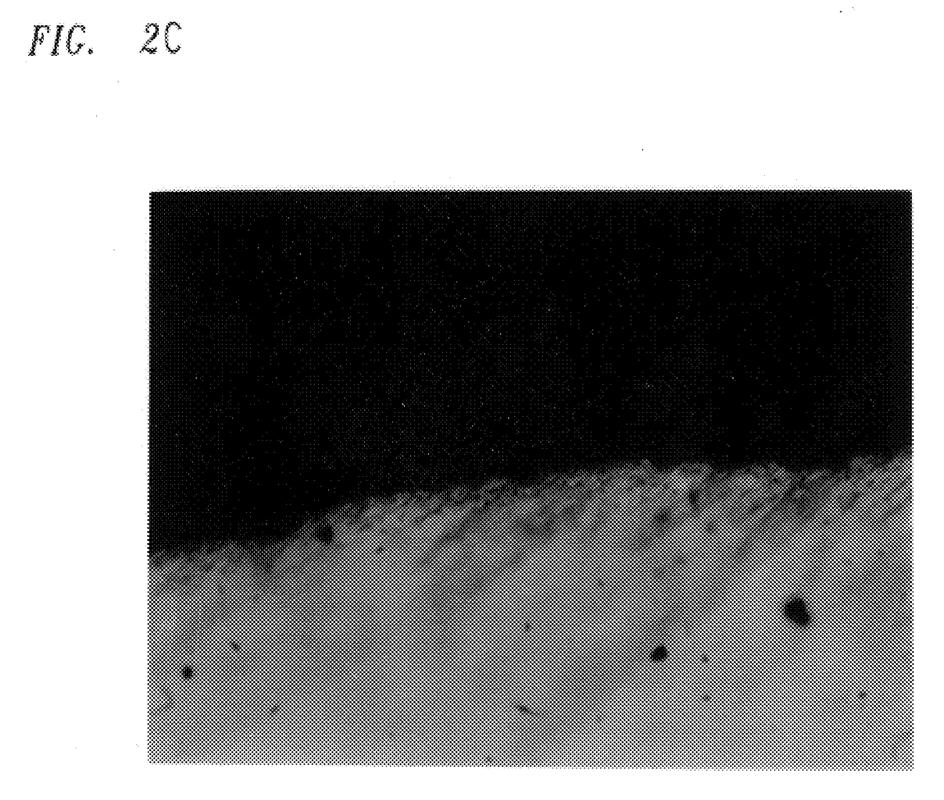

As illustrated in FIGS. 2A–2C, surface irregularities (typically referred to as "orange peel") appear in the lead frame substrate when the lead frame is formed according to the JEDEC standard. FIG. 2A is a photograph of an alloy 194 lead frame that has been formed to an angle of 90 degrees with a radius of about 250 $\mu$m. The photograph reveals, at 200× magnification, the surface irregularities that result from the forming process. FIG. 2B is a photograph of the identical lead frame, but at 400× magnification. Again the "orange peel" irregularities are clearly revealed in this photograph. FIG. 2C is a photograph of the identical lead frame, but from a side perspective. This photograph, at 1000× magnification, reveals troughs with a depth of up to 3 $\mu$m in the surface of the lead frame that result from the forming process.

As previously noted, if these surface irregularities crack the nickel coating, the underlying copper will oxidize, corrode, and migrate, in the presence of humidity, through the cracks to the surface of the coated lead frame. If the copper corrosion products form on the surface of the lead frame, it degrades the solderability and prevents adequate mechanical and electrical connection between the lead frame and other components. Consequently, a nickel layer that does not crack when the lead frame is formed is highly desirable.

The conformable nickel coating is formed on the substrate using an electroplating process in which the pH of the bath is maintained in the range of about 2 to about 2.5. The metal lead frame is placed in an electroplating bath containing a nickel complex and a nickel salt. In one embodiment, the bath contains about 75 g/l to about 130 g/l of: nickel as a nickel complex such as $Ni(NH_2SO_3)_2$ and about 3 g/l to about 5 g/l of a nickel salt such as $NiCl_2.6H_2O$. It is advantageous if the plating bath contains about 30 g/l to about 45 g/l of a buffer such as $H_3BO_3$ and about 5 ml/l to about 20 ml/l of a perfluorinated quaternary amine wetting agent such as, for example, perfluoro dodecyl trimethyl ammonium fluoride. The bath contains about 5 ml/l to about 20 ml/l of the wetting agent based on an aqueous solution that contains about 10 ppm of the perfluorinated quaternary amine.

It is advantageous if the bath contains 30 ppm or less of metal impurities. Specifically, it is advantageous if the bath contains less than 20 ppm iron impurities, less than 25 ppm copper, tin, and zinc impurities, and less than 30 ppm lead impurities.

A current density of about 5 Amps/dm$^2$ to about 50 Amps/dm$^2$ is applied to the bath, which is maintained at a temperature of about 50° C. to about 65° C. to plate a layer of nickel on the lead frame substrate. The thickness of the nickel layer is at least about 0.5 $\mu$m. It is advantageous if the nickel layer has a thickness of at least about 2 $\mu$m. The current density and plating time required to obtain a nickel layer of a desired thickness is easily determined by one skilled in the art.

Once the nickel layer is formed on the substrate, other layers of material maybe formed over the nickel layer to impart desirable properties to the coated lead frame. For example as described in U.S. Pat. No. 5,360,991 to Abys et al., which is hereby incorporated by reference, a layer of palladium strike or gold strike is formed over the nickel layer, followed by a layer of palladium-nickel alloy, followed by a palladium layer. These subsequent layers are largely a matter of design choice. However, as previously noted, it is advantageous for a noble metal layer to be formed over the nickel layer to provide a solderable surface. Since nickel oxidizes in air, and oxidized nickel is not a desirable surface for making electrical connections, it is advantageous if the nickel layer is covered by a layer of material with good conductivity that does not oxidize in air. Palladium, gold, and silver are examples of materials that do not oxidize in air.

The following examples are for illustrative purposes only.

EXAMPLE 1

A plating bath was prepared by combining 120 g of: nickel as a nickel complex, $Ni(NH_2SO_3)_2$, 5 grams of a nickel salt ($NiCl_2.6H_2O$), and 30 grams of a buffer, $H_3BO_3$, and diluting the mixture to one liter volume with water. To this mixture was added 20 ml/l of an aqueous solution containing 10 ppm perfluoro dodecyl trimethyl ammonium fluoride. The bath temperature was maintained at 60° C. and the bath pH was 2 during plating. The bath was agitated at a rate of 25 cm/sec.

EXAMPLE 2

The bath described in Example 1 was used to plate nickel on a variety of metal lead frame substrates. In this example, a 2.5 µm-thick layer of conformable nickel was formed on an alloy 194 lead frame with a thickness of 0.127 mm by applying a current density of 10 $A/dm^2$ to the bath for 1.5 minutes. A 0.025 µm-thick layer of palladium strike was formed over the nickel layer, followed by a 0.075 µm-thick layer of palladium-nickel alloy (80 weight percent palladium), followed by a 0.075 µm-thick layer of palladium plate. The conditions used to plate the layers of palladium strike, palladium-nickel alloy, and palladium plate are well known to one skilled in the art and are described in U.S. Pat. No. 5,360,991 to Abys et al., U.S. Pat. No. 5,178,745 to Abys et al., U.S. Pat. No. 4,911,798 to Abys et al., and U.S. Pat. No. 4,911,799 to Abys et al., all of which are incorporated by reference herein.

EXAMPLE 3

In this example, a 3.75 µm-thick conformable layer of nickel was formed on an alloy 194 lead frame having a thickness of 0.2032 mm by applying a current density of 10 $A/dm^2$ to the bath described in Example 1 for 2 minutes and 15 seconds. A 0.025 µm-thick layer of palladium strike was formed over the nickel layer, followed by a 0.075 µm-thick layer of palladium-nickel alloy (80 weight percent palladium), followed by a 0.075 µm-thick layer of palladium plate.

Figure 3A:
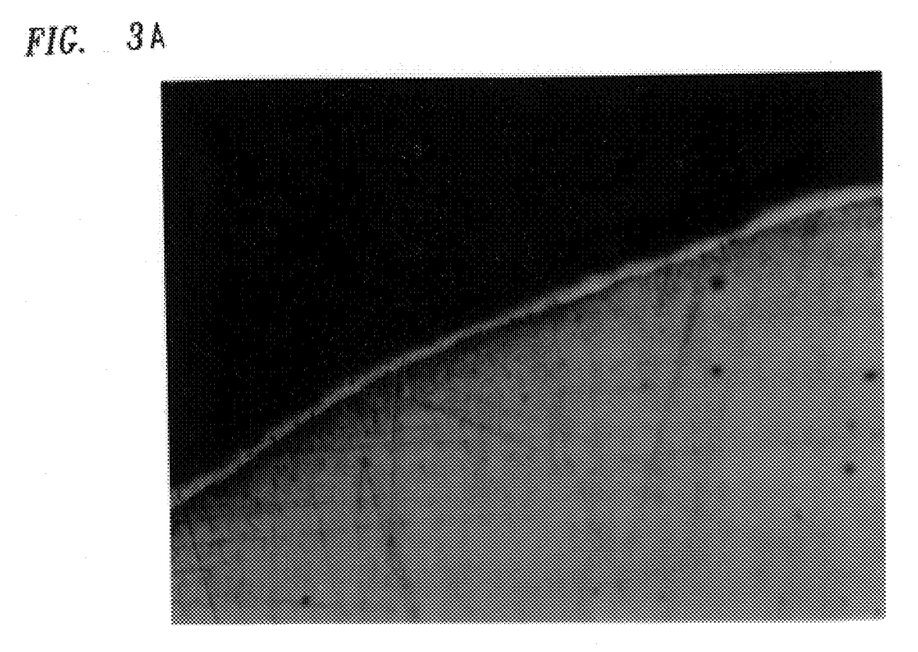
FIGS. 3A and 3B are photographs in side view of an alloy 194 lead frame with a conformable nickel layer plated thereon and formed to an angle of 90 degrees with a curvature radius of about 250 $\mu$m at 400× magnification and 1000× magnification.
Figure 3B:
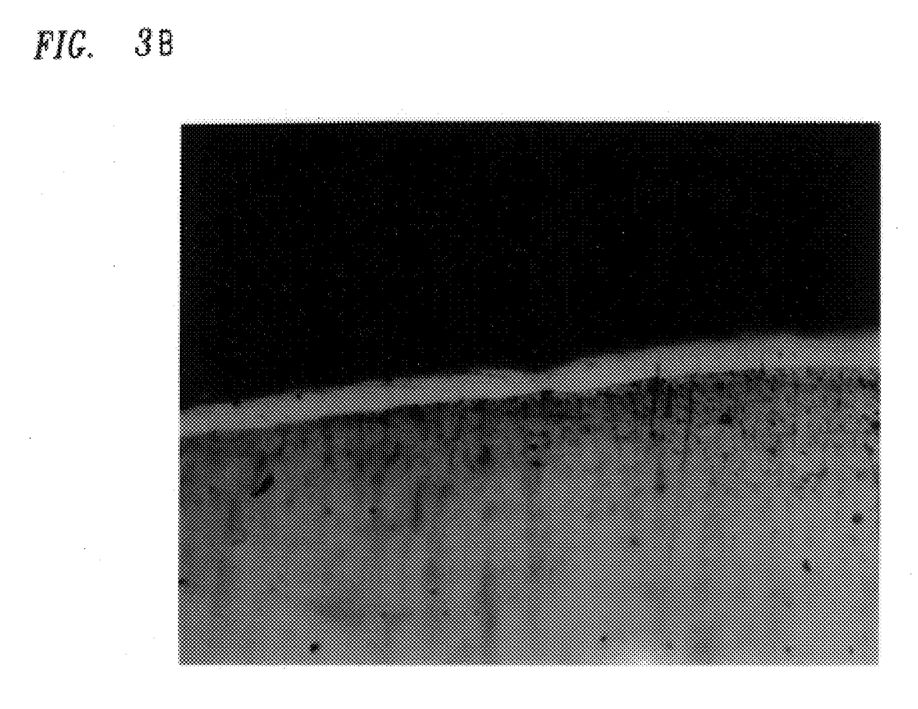

The lead frame was then formed according to the JEDEC standard, i.e. the leads were bent to form an angle of 90 degrees with the substrate with a radius of about 250 µm. FIGS. 3A and 3B are photographs of the lead frame. Both are photographs taken from a side perspective. FIG. 3A is at 400× magnification and FIG. 3B is a photograph at 1000× magnification. Both photographs demonstrate that cracks did not form through the thickness of the conformable nickel coating of the present invention as a result of the forming process.

EXAMPLE 4

A copper strike was plated over an alloy 42 lead frame having a thickness of 0.1524 mm. The copper strike was 0.125 µm thick and was plated with a current density of 2.6 $A/dm^2$. From the same solution, a 4 µm thick layer of copper was plated over the copper strike. The copper electroplating bath contained 42 g/l of copper cyanide, 66.6 g/l of potassium cyanide, 30 g/l of potassium carbonate, and 60 g/l of Rochelle salt. This is a commercially available copper electroplating bath that is well known to one skilled in the art. The copper bath was maintained at a temperature of 45° C. to 55° C. and a pH of 10.2 to 10.5 during plating. A current density of 1.3 $A/dm^2$ was applied for 20 minutes to obtain a coating of the desired thickness.

A 2.5 µm-thick layer of nickel was plated on the copper coated substrate using a commercially available sulfamate nickel plating bath obtained from Witco Corporation. The bath composition contained 75 g/l of: nickel as nickel sulfamate, 5 g/l of $NiCl_2.6H_2O$, 30 g/l of $H_3BO_3$, combined with enough water to dilute the mixture to one liter. To this was added 0.3 volume percent Barret SNAP A/M (an anti-pit agent) and 7.8 ml/l of Barret SNHA (a hardening agent). The temperature of the plating bath was maintained at 50° C. and the pH was maintained at 4.0. Moderate agitation was used to mix the bath. A 0.175 µm-thick coating of palladium was then applied over the nickel layer.

EXAMPLE 5

A 0.125 µm thick layer of nickel strike was plated on an alloy 42 lead frame with a thickness of 0.1524 mm using the Wood's Nickel process. In the Wood's Nickel process, the substrate is placed in a bath containing 240 g/l of nickel chloride and 120 ml/l of hydrochloric acid. The bath was equipped with a nickel electrode. The bath pH was 0.6 and the temperature of the bath was ambient. The nickel layer was plated by applying a current density of about 2 $A/dm^2$ to about 5 $A/dm^2$ for one minute. A 4 µm-thick layer of copper was then plated over the nickel strike using the materials and conditions described in Example 4. A 2.5 µm-thick layer of nickel was plated on the copper coated substrate using the commercially available sulfamate nickel plating bath described in Example 4. A 0.175 µm-thick coating of palladium was then applied over the nickel layer.

EXAMPLE 6

A copper strike was plated over an alloy 42 lead frame having a thickness of 0.1524 mm. The copper strike was 0.125 µm thick and was plated using a current density of 2.6 $A/dm^2$. From the same solution, a 4 µm thick layer of copper was plated over the copper strike using the materials and conditions described in Example 4. A 2.5 µm-thick layer of conformable nickel was plated on the copper coated substrate using the conditions described in Example 2. A 0.175 µm-thick coating of palladium was then applied over the nickel layer.

EXAMPLE 7

A 3.75 µm-thick layer of nickel was plated on a lead frame substrate made of alloy 194 with a thickness of 0.127 using the prior art process and materials described in Example 4. A 0.15 μm-thick layer of palladium was formed over the nickel layer. The lead frame was then formed according to the JEDEC standard. That is, the leads were bent to an angle of 90 degrees relative to the lead frame. The radius of the bend was 250 μm.

Figure 4A:
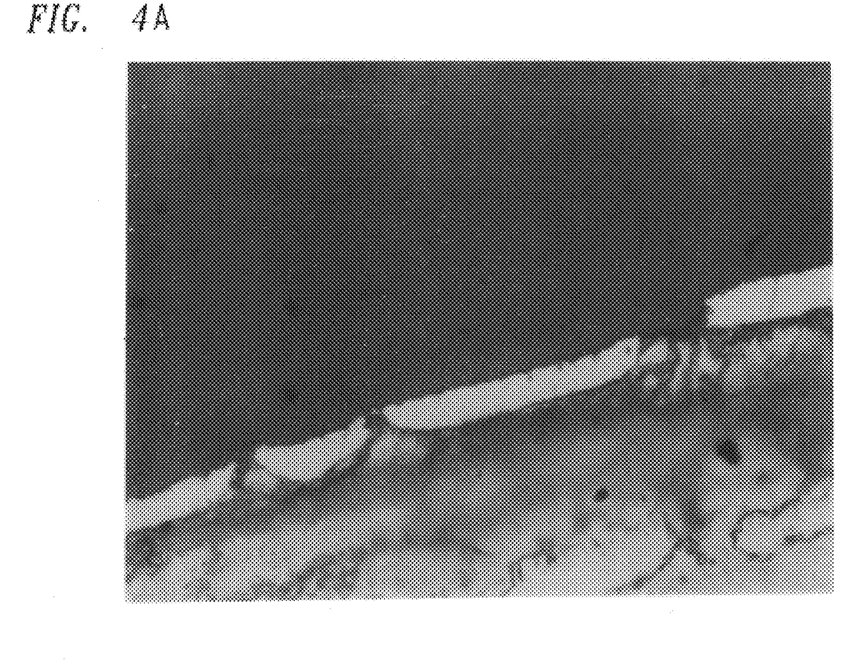
FIGS. 4A and 4B are photographs of an alloy 194 lead frame with a commercial nickel layer plated thereon according to a prior art process and formed to an angle of 90 degrees with a curvature radius of about 250 $\mu$m at 1000× magnification.
Figure 4B:
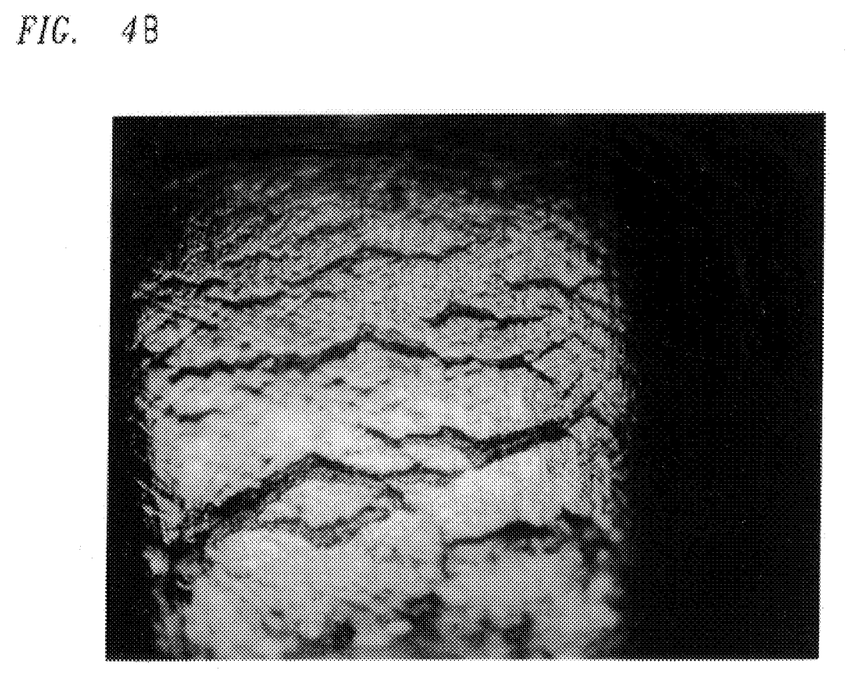

As illustrated in FIGS. 4A and 4B, cracks formed in this nickel layer as a result of the forming process. FIG. 4A is a photograph of the formed lead frame from a side perspective at 1000× magnification. FIG. 4B is a photograph of the same nickel coating in plan view. In FIG. 4A, the palladium coated over the nickel layer does not show up as a separate layer. FIGS. 4A and 4B illustrate that the cracks that form in nickel as a result of the forming process also form in the palladium coated over the nickel layer. As previously mentioned, such cracking is detrimental to the solderability of the lead frame surface.

EXAMPLE 8

To demonstrate the improvement provided by the conformable nickel coating of the present invention, lead frames prepared as described in Examples 2, 3, and 7 were subjected to standard tests used to determine if a coating is satisfactory. The coated lead frames described in Examples 2 and 7 were subjected to a standard test, MIL-STD-833 (both TM 2003 and TM 2022). Method 2003 is a solderability test, i.e., a "dip-and-look" test to determine if the solder adheres to the coated metal substrate in the requisite amount of time. Method 2022 is a test to determine the wetting speed of the solder. The lead frame passed Method 2003 because the solder covered over 95 percent of the lead frame surface. The lead frame passed Method 2022 because the standard calls for the solder to wet the surface in under one second. By contrast, the lead frame coated with nickel according to the process described in Example 7 failed both of these tests.

Figure 5:
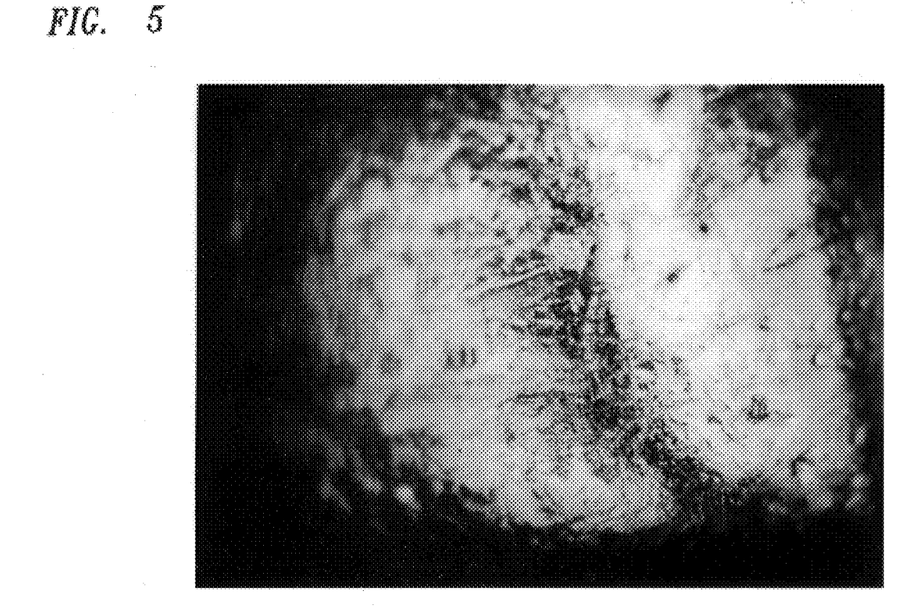
FIG. 5 is a photograph of the lead frame depicted in FIGS. 3A and 3B after exposure to steam age for 8 hours and soldered using a non-activated rosin flux.
Figure 6:
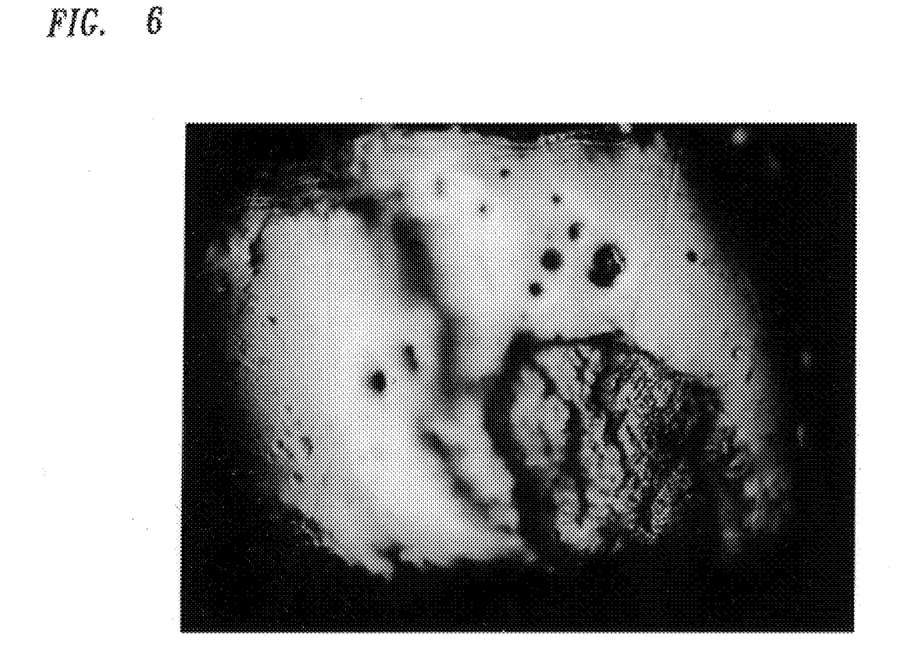
FIG. 6 is a photograph of the leadframe depicted in FIGS. 4A and 4B after exposure to steam age for 8 hours and soldered using a non-activated rosin flux.

The coated lead frames described in Examples 3 and 7 were subjected to a standard test, J-STD-002 (both category 2 and category 3). Category 2 is a one hour steam age before the "dip-and-look" test". Category 3 is an eight hour steam age before the "dip-and-look test". The Example 3 lead frame passed Category 2 because the solder covered over 95% of the lead frame. The Example 3 lead frame passed Category 3 because the solder covered over 95% of the lead frame. By contrast, a lead frame coated with nickel according to the process described in Example 7 failed both of these tests. This is illustrated by FIGS. 5 and 6. FIG. 5 is a photograph of the leadframe described in Example 3 after steam aging for 8 hours followed by the application of solder according to Method 2003. As shown by FIG. 5, the coating uniformly covers the substrate. FIG. 6 is a photograph of the leadframe described in Example 7 after steam aging for 8 hours followed by the application of solder according to Method 2003. As shown by FIG. 6, a relatively large hole appeared in the coating, exposing the underlying substrate.

EXAMPLE 9

The lead frames described in Examples 4–6 were subjected to a test for corrosion resistance (ASTM B-117). During this test, a lead frame is subjected to a salt fog at a temperature of 35° C. for at least 24 hours. The lead frames were formed such that the leads formed an angle of 90 degrees with the lead frame with a 250 μm radius of curvature. The lead frames were then subjected to salt spray. The results of this test are summarized in Table 1 below.

TABLE 1

| Lead Frame | After 8 hours | Ater 24 hours |
| --- | --- | --- |
| Example 4 | 50% rusted (fail) | 100% rusted (fail) |
| Example 5 | 50% rusted (fail) | 100% rusted (fail) |
| Example 6 | <5% rusted (pass) | <5% rusted (pass) |

These results indicate that, non-copper or non-copper alloy lead frame substrates (such as the nickel/iron alloy 42) pass the ASTM B-117 test if a layer of copper is plated over the substrate, and a layer of conformable nickel is plated over the copper. Table 1 demonstrates that alloy 42 substrates were not adequately protected by a copper strike layer, a copper layer, and a non-conformable nickel layer or a nickel strike layer, a copper layer, and a non-conformable nickel layer. Applicants believe that copper layers having a thickness of about 0.5 μm to about 10 μm are suitable if interposed between the lead frame substrate and the conformable nickel layer.

Figure 7:
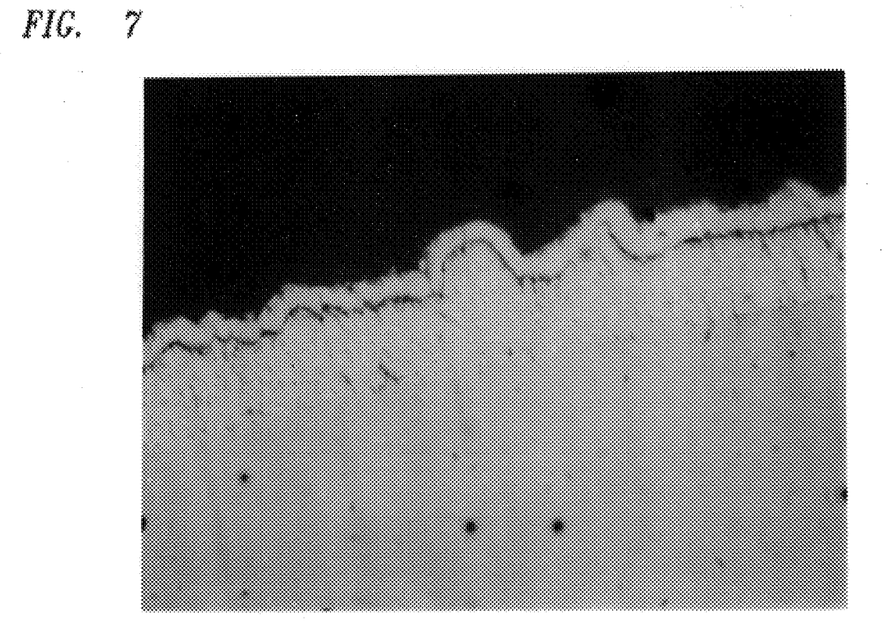
FIG. 7 is a side view photograph of an alloy 42 leadframe with successive layers of copper, nickel, and palladium plated thereover. The nickel layer is the conformable nickel coating of the present invention. The lead frame was formed to an angle of 90 degrees with a forming radius of 250 $\mu$m.
Figure 8:
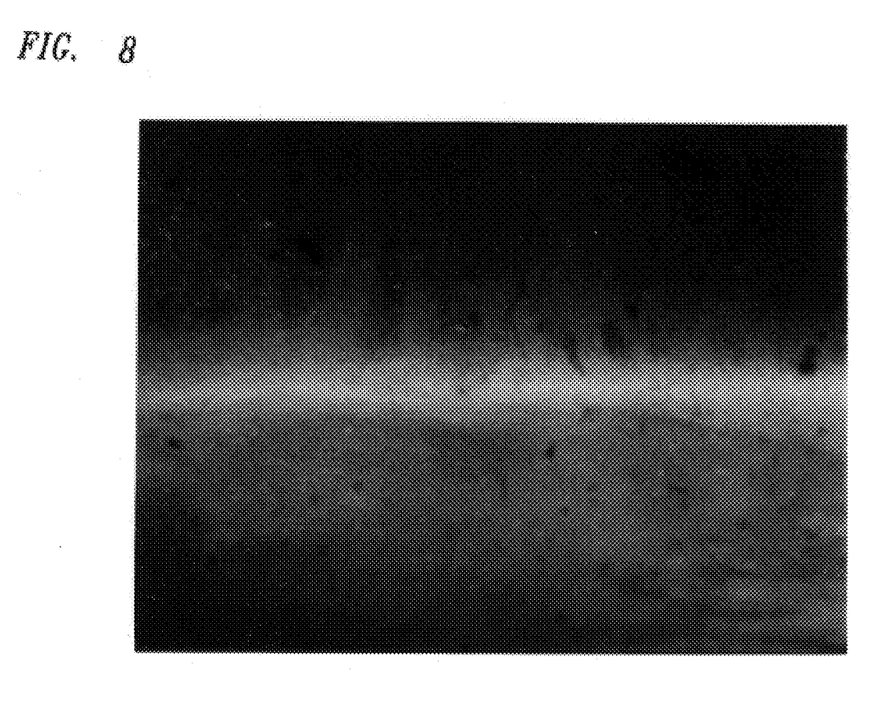
FIG. 8 is a plane view photograph of the FIG. 7 leadframe after exposure to salt spray for 24 hours.

The superior performance of the conformable nickel coating of the present invention is also illustrated in FIGS. 7–10. FIG. 7 is a side view photograph of the lead frame prepared as described in Example 6, which was formed according to JEDEC standard to an angle of 90 degrees with a 250 μm radius of curvature. FIG. 7 demonstrates that, even after forming, the conformable nickel coating provides a uniform coating over the underlying layer, despite the surface deformations therein. FIG. 8 is a photograph of the same lead frame after being subjected to salt spray for 24 hours. FIG. 8 demonstrates that no rust appeared on the leadframe, even after being subjected to the corrosive effects of salt spray for 24 hours. This is further evidence that the coating of applicants' invention provided a uniform coating over the underlying substrate, since, if cracks through the coating to the underlying copper had appeared, rust would have formed on the lead frame surface after being subjected to the corrosive effects of salt spray for 24 hours.

Figure 9:
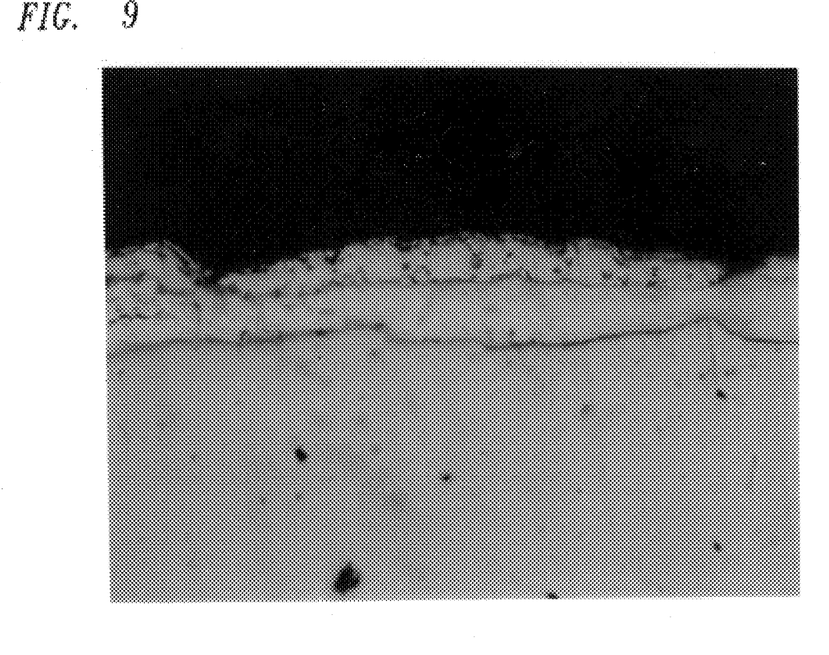
FIG. 9 is a side view photograph of an alloy 42 leadframe with successive layers of copper, nickel and palladium plated thereover. The nickel layer was plated using a prior art process. The lead frame was formed to an angle of 90 degrees with a forming radius of 250 $\mu$m.
Figure 10:
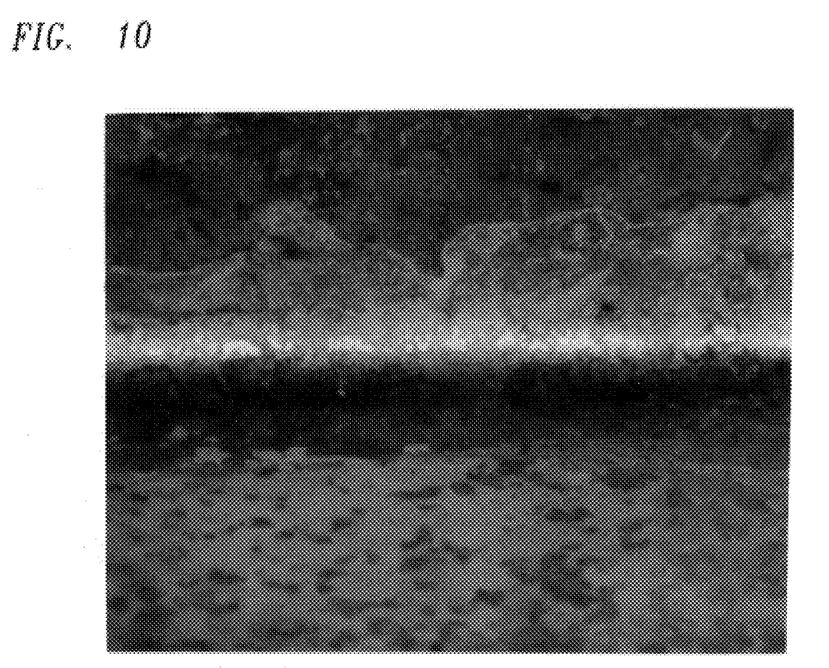
FIG. 10 is a plane view photograph of the FIG. 9 lead frame after exposure to salt spray for 8 hours.

FIG. 9 is a side view photograph of the lead frame prepared as described in Example 4. A standard commercially available nickel plating process was used to form the nickel layer on the lead frame described in Example 4. The lead frame was formed according to JEDEC standard to a forming angle of 90° C. and a forming radius of 250 μm. FIG. 9 clearly demonstrates that cracks appeared in the nickel layer overlying the copper layer formed on the lead frame. Comparing FIGS. 7 and 9 clearly demonstrates the superiority of the nickel layer of the present invention. FIG. 10 is a photograph of the same lead frame shown in FIG. 9 after being subjected to salt spray for 8 hours. Rust is clearly visible in FIG. 10. This further demonstrates that cracks appeared in the nickel layer of the leadframe described in Example 4. Therefore, cracks do not appear in the nickel layer of the present invention after the lead frame on which the coating is applied has been formed according to JEDEC standard. This is in contrast to prior art nickel coatings, in which cracks do appear when the lead frame on which these coatings are applied are formed according to JEDEC standards.

EXAMPLE 10

A variety of substrates were coated with the conformable nickel coating of the present invention using the formulation described in Example 1. These substrates were then formed. The degree of bending was varied from 90 to 180 degrees. The surface non-uniformity of these formed substrates was observed and characterized in terms of the depth of the depressions observed in the substrate surface. The conformable nickel coatings were examined to determine if they cracked during the forming process. The following Table 2 summarizes the results.

TABLE 2

| Substrate (alloy) | Thickness ($\mu$m) | Bend (degrees) | Curv. Rad. ($\mu$m) | Depression ($\mu$m) | Crack |
|---|---|---|---|---|---|
| Cu 194 | 200 | 90 | 150 | 2 | no |
| Cu 194 | 200 | 180 | 500 | 3 | no |
| Cu 194 | 250 | 90 | 150 | 2 | no |
| Cu 194 | 250 | 180 | 500 | 3 | no |
| Cu 194 | 250 | 180 | 250 | >5 | yes |
| BeCu | 125 | 180 | 250 | 3 | no |
| Alloy 42 | 150 | 90 | 250 | 2 | no |
| Alloy 42 | 150 | 180 | 875 | 1 | no |

As demonstrated by Table 2, the conformable nickel coating of the present invention resists cracking if the depressions in the lead frame substrate that results from the forming process are less than 5 $\mu$m in depth.

What is claimed is:

1. A lead frame comprising a substrate made of a material selected from the group consisting of alloy 151, alloy 194, alloy 7025, and alloy 42 with a conformable nickel coating thereon with a thickness of at least about 0.5 $\mu$m wherein cracks through the thickness of the nickel layer do not form when the lead frame is bent to an angle of at least about 82 degrees with a forming radius of about 150 $\mu$m to about 300 $\mu$m when the depth of the surface deformations that appear in the metal substrate as a result of the bending do not exceed about 5 $\mu$m.

2. The lead frame of claim 1 wherein the surface deformations that result when the lead frame is bent have a depth of at least 0.1 $\mu$m.

3. The lead frame of claim 1 wherein a layer of copper with a thickness of about 0.5 $\mu$m to about 10 $\mu$m is interposed between the leadframe substrate and the nickel layer.

4. The lead frame of claim 3 further comprising a nickel strike layer interposed between the leadframe substrate and the copper layer.

5. The lead frame of claim 4 further comprising at least one layer of a noble metal material selected from the group consisting of gold, palladium, platinum, silver, and alloys thereof.

6. A lead frame comprising a substrate made of a material selected from the group consisting of copper, copper alloys and nickel alloys with a conformable nickel coating thereon with a thickness of at least about 0.5 $\mu$m wherein cracks through the thickness of the nickel layer do not form when the lead frame is bent to an angle of at least about 82 degrees with a forming radius of about 150 $\mu$m to about 300 $\mu$m when the depth of the surface deformations that appear in the metal substrate as a result of the bending do not exceed about 5 $\mu$m and wherein the conformable nickel coating is formed by placing the substrate in a nickel bath comprising about 75 g/l to about 130 g/l of nickel as a nickel complex, about 3 g/l of a nickel salt, about 30 g/l to about 45 g/l of a buffer, and about 5 ml/l to about 20 ml/l of a perfluorinated quaternary amine wetting agent and maintaining the pH of the bath in the range of about 2 to about 2.5 while applying a current density of about 5 Amps/dm$^2$ to about 50 Amps/dm$^2$ for a period of time sufficient to plate a layer of nickel of the desired thickness onto the substrate.

7. The lead frame of claim 6 wherein the nickel bath is maintained at a temperature of about 50° C. to about 65° C. during plating.

8. The lead frame of claim 7 wherein the nickel bath is agitated at a speed of about 25 cm/sec to about 60 cm/sec during plating.

9. The lead frame of claim 8 wherein the nickel complex is nickel sulfamate and the nickel salt is nickel chloride.

10. The lead frame of claim 9 wherein the perfluorinated quaternary amine is perfluoro dodecyl trimethyl ammonium fluoride.

11. The lead frame of claim 6 wherein the surface deformations that result when the lead frame is bent have a depth of at least 0.1 $\mu$m.

12. The lead frame of claim 6 wherein a layer of copper with a thickness of about 0.5 $\mu$m to about 10 $\mu$m is interposed between the leadframe substrate and the nickel layer.

13. The lead frame of claim 12 further comprising a nickel strike layer interposed between the leadframe substrate and the copper layer.

14. The lead frame of claim 13 further comprising at least one layer of a noble metal material selected from the group consisting of gold, palladium, platinum, silver, and alloys thereof.

* * * * *